United States Patent [19]

Marshall

[11] Patent Number: 4,973,911
[45] Date of Patent: Nov. 27, 1990

[54] APPARATUS FOR ELECTROMAGNETIC COMPATIBILITY TESTING

[76] Inventor: Richard C. Marshall, "The Dappled House", 30, Ox Lane,, Harpenden, Herts., AL5, England

[21] Appl. No.: 310,772

[22] Filed: Feb. 14, 1989

[30] Foreign Application Priority Data

Feb. 19, 1988 [GB] United Kingdom ............... 8803853

[51] Int. Cl.$^5$ ...................... G01R 31/02; G01R 27/04
[52] U.S. Cl. .................................. 324/628; 324/627; 324/603; 324/529; 324/539
[58] Field of Search ............... 324/539, 529, 537, 543, 324/627, 628, 603

[56] References Cited

U.S. PATENT DOCUMENTS

| | | | |
|---|---|---|---|
| 3,492,568 | 1/1970 | Johnson | 324/57 R |
| 3,718,813 | 2/1973 | Williams | 324/57 PS |
| 3,839,672 | 10/1974 | Anderson | 324/58 A |
| 4,023,098 | 5/1977 | Roth | 324/57 PS |
| 4,425,542 | 1/1984 | Tsaliovich | 324/58 R |
| 4,463,309 | 7/1984 | Crochet | 324/57 R |
| 4,547,731 | 10/1985 | Teratani | 324/58 R |
| 4,647,844 | 3/1987 | Biegon | 324/57 R |

FOREIGN PATENT DOCUMENTS

| | | |
|---|---|---|
| 35846 | 9/1981 | European Pat. Off. . |
| 534577 | 3/1941 | United Kingdom . |
| 2090002 | 6/1982 | United Kingdom . |

OTHER PUBLICATIONS

Model 3582A-HP Catalog-1983-pp. 508-509.

Primary Examiner—Reinhard J. Eisenzopf
Assistant Examiner—Jose M. Solis
Attorney, Agent, or Firm—James J. Ralabate

[57] ABSTRACT

An apparatus for determining the electromagnetic compatibility of a system, including a wide-band frequency source 2, optionally subject to frequency and amplitude modulation, and coupled to a cable 9 of the system. Accuracy may be improved by the addition of a current measuring arrangement 11, 12. The two coupling devices may be split and assembled into hinged frames to facilitate use.

12 Claims, 2 Drawing Sheets

APPARATUS FOR ELECTROMAGNETIC COMPATIBILITY TESTING

This invention relates to apparatus and methods for the testing of a variety of electrical and electronic apparatus to ensure compatibility with the electromagnetic environment.

In order to determine if apparatus will malfunction as a result of electromagnetic energy unintentionally received from fields in the environment—for example, coupled by the cables associated with such apparatus acting as receiving aerials—it is well known to test said apparatus by exposure to a known energy environment. This has been accomplished hitherto either by establishing an electromagnetic field around the apparatus, or by injecting electrical energy directly into the connecting cables. The apparatus is said to be immune to a particular level of energy provided that malfunction does not result from its application. Examples of such methods are to be found in British Standard 905 and in Defence Standard 59-41. To achieve accurate and repeatable measurements such test methods and apparatus have been complex and bulky, and it has been necessary to use them in a well-defined spatial environment.

In European patent application No. A2 0089 786 there is disclosed high-frequency current inducing means which may be used to couple energy inductively into the cables of a system. However, by virtue of its unsymmetrical configuration this device will act in the differential mode as well as in the common mode and so will not accurately simulate the real-world environment. Furthermore, the coupling will be critically dependant on the position and orientation of the cable within the current-inducing chamber. It is also known to use toroidal ferrite-cored transformers as current-inducing means. In practice the current induced by either means is uncertain because the circuit impedance is ill-defined.

Hitherto, energy has been supplied in turn at every frequency likely to be encountered in the working environment, typically requiring tests over the wide range from 100KHz to 1000MHz. At each frequency exposure has been for a time sufficient for the system under test to pass through any stage of its operation during which it is particularly susceptible. Consequently, it has taken a long time to perform a test over the necessary frequency range. Apparatus that may be programmed to provide a varying frequency or a sequence of test frequencies is described in United Kingdom patent application GB No. 2 090 002 A and also in UK patent specification No. 534 577. However, when adjusted to sweep over a wide frequency range, such apparatus can only produce energy intermittently within any narrow frequency band.

Reference may also be made to European Patent No. 0 035 846 A2.

According to the present invention there is provided apparatus adapted to determine the electromagnetic compatibility of a system, said apparatus including firstly a source of electromagnetic energy adapted so that said energy is widely distributed in the domains of both time and frequency, and secondly near-field magnetic coupling means adapted to inject said energy as a flow of common-mode current in a cable of said system. The magnitude of said current may be chosen to approximate to that likely to result from exposure to the working environment, which may vary from 1mA to 10mA in a benign environment, and from 100mA to 1 amp in industrial situations and locations near to high-power radio transmitters.

An embodiment of the invention will now be described by way of example with reference to the accompanying drawing, in which.

Figure 1:
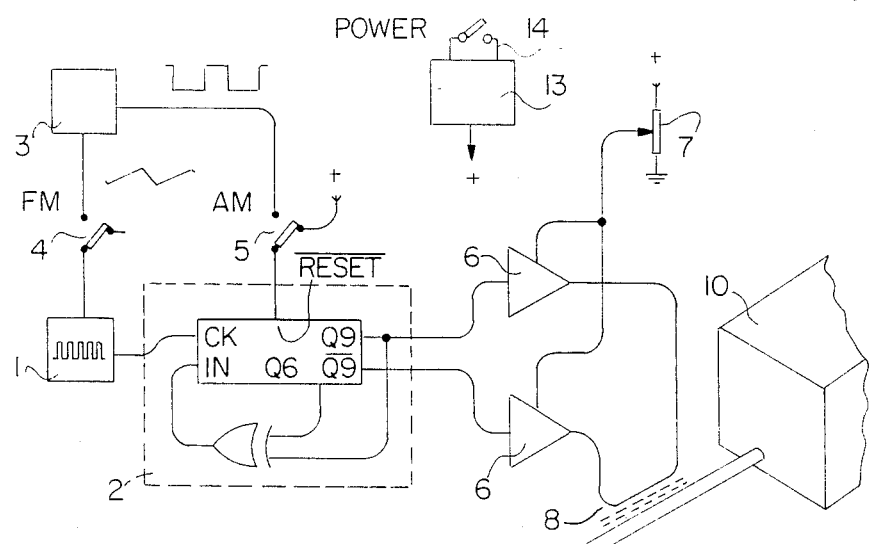
FIG. 1 shows the embodiment in schematic form.

Referring to FIG. 1, it will be seen that a digital clock oscillator 1 of frequency f drives a pseudo-random sequence generator 2 constructed from shift register and exclusive-or devices according to the teaching of S. Golomb in his book "Shift Register Sequences" published by Holden-Day in 1967. If this sequence generator has n stages, then the resulting output waveform will have spectral components at intervals of $f/(2^n-1)$ across a theoretically-infinite frequency range. For example if f=50MHz and n=10, said components are spaced at 48.828 KHz intervals. Harmonic generation by the rectangular waveforms of the digital logic circuits used will extend the frequency range upwards to an extent determined by the state transition times of the devices used. This frequency may be of the order of 300MHz for fast schottky devices. To spread the energy more uniformly within this frequency range, to reduce the number of stages in the sequence generator, or to excite particular modes of susceptibility in the system under test, an audio-frequency oscillator may optionally be connected by the switch 4 so as to frequency-modulate the clock oscillator 1, for example by applying a sawtooth waveform to a variable-capacitance diode that might form part of the frequency-determining circuit therein.

Furthermore, the output of the sequence generator may optionally be amplitude modulated, so as to excite particular modes of susceptibility or reduce the mean power consumed and radiated by the source apparatus. For example, the oscillator 3 may employ a type LM555 integrated circuit manufactured by National Semiconductor Corporation providing both sawtooth and squarewave outputs, and the squarewave output may be connected via the switch 5 to the complemented logic reset input of the shift register within the sequence generator 2 so as to interrupt the sequence at an audio-frequency.

As an alternative to the above-described generating means, a noise generator comprising, for example, a reverse-biased semiconductor diode and preamplifier may be used, either alone or in combination with heterodyne frequency conversion means.

The amplifier 6 may comprise a push-pull parallel arrangement of bus driver circuits driven from the true and complement outputs of the sequence generator. The necessary circuits are available in, for example, the integrated circuit 74F240 manufactured by Fairchild. High-speed digital circuits are preferred to maximise the harmonic content of the output and so maximise the energy distribution in the frequency domain. The total output power may be adjusted by an attenuator or, as in this embodiment, by reducing the supply voltage by means of a potentiometer 7. The near-field magnetic coupling means comprise a transformer 8, whose primary is connected to the power amplifier and harmonic generator 6. The term "amplifier" throughout this disclosure is intended to include a power amplifier and harmonic generator, whose secondary is a cable 9 associated with the system 10 that is to be tested, and whose core consists of a number of ferrite "U" cores. It is to be understood that the number of turns on each winding is dependent on the output impedance of the amplifier 6 and upon the common-mode impedance of the cable 9.

It will be evident that the current induced in the cable 9, which is a measure of the immunity level to which the system is being tested, depends not only on the voltage output of the amplifier 6 and its output impedance but also on the common mode impedance of the cable 9. Therefore, a second transformer 11 is provided which acts as a current transformer with burden impedance 11c, allowing the indicator 12 to display the current actually induced in the cable 9. The operator may then adjust the power level by means of the potentiometer 7 until the desired current is indicated by 12. It is within the scope of this invention to provide feedback means to automatically set the power level of amplifier 6 to the desired current value. It should be noted that the current measuring circuit may be used independently of the energy generating circuit if the potentiometer 7 is set to minimum.

The direct-current power source 13 may include a mains transformer and rectifier, but it preferably embodies a battery to enhance portability and avoid possible disturbance of the local electromagnetic field by a mains supply cable. The power switch 14 may be coupled to the hinge mechanism to be described with reference to FIG. 3 so as to ensure that battery power is only consumed whilst the test apparatus is held around a cable of the system under test. Such battery-powered apparatus may include charging means and state-of-charge indication in the usual way.

Figure 2:
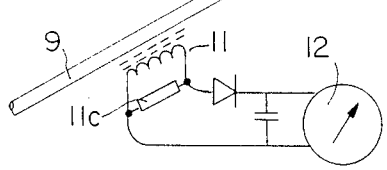
FIG. 2 shows the coupling and measuring devices in/detailed perspective form.
Figure 2:
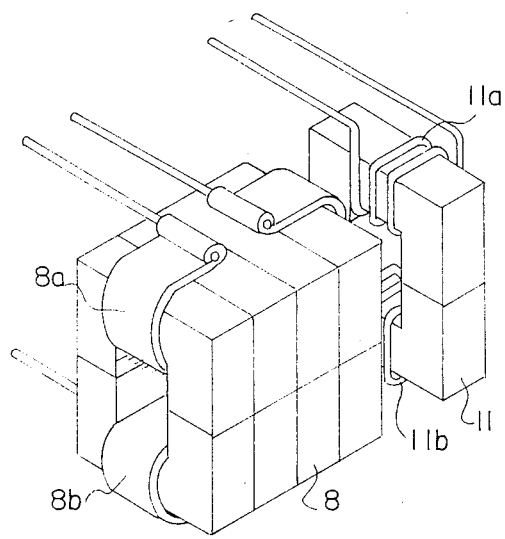

In the detailed perspective view of FIG. 2, the cable (9 of FIG. 1) and the system under test (10 of FIG. 1) have been omitted for clarity. It is to be understood that said cable passes through the centre of the cores between windings 8a and 8b. Transformers 8 and 11 may be seen to include two core assemblies spaced apart to minimise direct magnetic coupling. Each is made from 'U' ferrite pieces type 34-018-36 made by Neosid Ltd.. Transformer 8 employs four pairs of cores and its primary winding 8a and 8b consists of two copper strips wired in parallel and disposed on either side of the slot to minimise the assymmetry of the field. This arrangement will prevent differential-mode induction between the cores of the cable and also avoid variation of the coupling according to the position and orientation of the cable. In addition to magnetic coupling this construction will provide capacitative coupling at high frequencies. When the dimensions of said primary windings are comparable with the wavelength a directional travelling wave will be induced into the cable. The secondary winding of transformer 11 is similarly divided into sections 11a and 11b but these each consist of 6 turns and are wired in series to provide the desired impedance.

Figure 3:
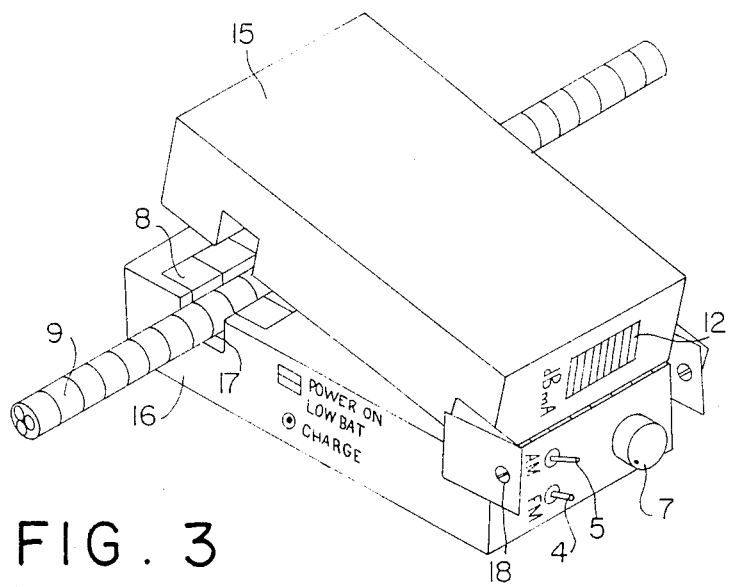
FIG. 3 shows the embodiment in perspective form.

In FIG. 3 may be seen a perspective view of the assembly numbered as above where appropriate. The upper and lower halves of the transformers 8 and 11 are assembled into upper and lower boxes 15 and 16 (though only the lower half of 8 is visible in this view). These boxes are hinged at 18 and when at rest are held apart by an internal spring. In use, the cable to be energised is introduced into the slot 17 and the boxes brought together around it. The slot may be so dimensioned that the cable may be looped and two or more turns introduced. When the core halves are in contact the test may be performed. The switch 14 described with reference to FIG. 1 may be actuated by this movement. The controls 4, 5, 7, and 12 are mounted on the end of the instrument convenient to the operator. In this embodiment the indicator 12 comprises a light-emitting diode bar array controlled by an integrated circuit type LM3915 manufactured by the National Semiconductor Corporation. This gives an indication of the current level in 3dB steps.

Figure 4:
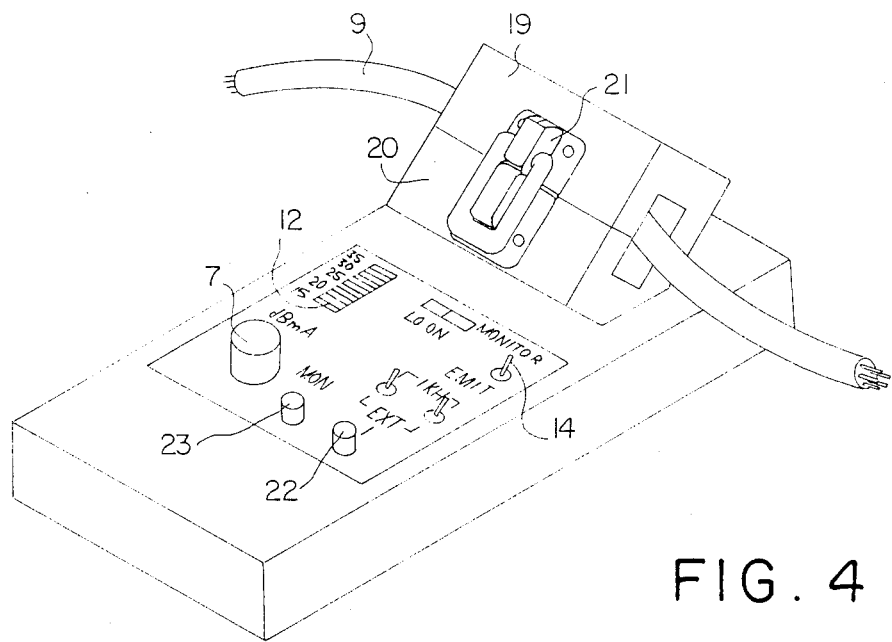
FIG. 4 shows an alternative embodiment in perspective form.

FIG. 4 shows an alternative embodiment in which the aperture through which the cable is inserted is visible at the same time as are the operating controls. The hinged case-halves 19 and 20 are lined with resilient plastic foam cushions, which locate the upper and lower sections of cores 8 and 11. When the case-halves are secured by catch 21 said foam urges the core faces into contact. Socket 22 allows an external oscillator to be used in place of oscillator 3. Socket 23 is connected across indicator 12 to allow remote monitoring, for example with an oscilloscope.

I claim:

1. Apparatus adapted to determine the electromagnetic compatibility of a system, said apparatus including (firstly) a source of electromagnetic energy adapted so that said energy is widely distributed in the domains of both time and frequency, (and secondly) near-field magnetic coupling means adapted to inject said energy as a flow of common-mode current in a cable of said system, a second magnetic coupling means arranged for cooperation with said cable, and an electrical measuring device associated with said second coupling means for providing a measurement of the current induced in said cable, whereby to determine if said system malfunctions at a given induced current.

2. Apparatus according to claim 1 that is powered by a battery built-in to said apparatus.

3. Apparatus according to claim 1 in which the frequency domain of said energy is extended both by harmonic generating means and by pseudo-random sequence generating means and is modulated by an audible frequency, and in which said near-field magnetic coupling means includes a transformer with a core of ferrite material constructed in two portions so as to allow easy installation around said cables and a primary circuit that is split into two sections symmetrically disposed about said cable, and in which a second magnetic coupling means and electrical measuring device cooperate with said cable so to as to enable measurement of the current induced therein.

4. Apparatus according to claim 1 in which the frequency domain of said energy is extended by harmonic generating means.

5. Apparatus according to claim 1 in which the frequency domain of said energy is extended by pseudo-random sequence generating means.

6. Apparatus according to claim 1 in which said energy is amplitude-modulated by an audible frequency.

7. Apparatus according to claim 1 in which said near-field magnetic coupling means includes a transformer with a core of ferrite material.

8. Apparatus according to claim 1 in which said near-field magnetic coupling means is constructed in two portions so as to allow easy installation around said cables.

9. Apparatus according to claim 1 in which the primary circuit of said magnetic coupling means is split into two sections symmetrically disposed about said cable.

10. Apparatus according to claim 1 in which the primary circuit of said magnetic coupling means is extended parallel to the axis of said cable so as to provide additional capacitative coupling to said cables.

11. Apparatus according to claim 1 in which said energy is distributed across part or all of said frequency domain by a random noise generator.

12. Apparatus according to claim 1 in which said energy is provided by a primary frequency source whose frequency is modulated by a secondary frequency source so as to distribute said energy across part or all of said domain.

* * * * *